United States Patent
Lin et al.

(10) Patent No.: US 9,666,624 B2
(45) Date of Patent: *May 30, 2017

(54) MECHANISMS FOR FORMING IMAGE-SENSOR DEVICE WITH DEEP-TRENCH ISOLATION STRUCTURE

(71) Applicant: TAIWAN SEMICONDUCTOR MANUFACTURING CO., LTD., Hsin-Chu (TW)

(72) Inventors: Jeng-Shyan Lin, Tainan (TW); Dun-Nian Yaung, Taipei (TW); Jen-Cheng Liu, Hsin-Chu (TW); Feng-Chi Hung, Hsin-Chu County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/093,285

(22) Filed: Apr. 7, 2016

(65) Prior Publication Data

US 2016/0225802 A1   Aug. 4, 2016

Related U.S. Application Data

(60) Continuation of application No. 14/822,575, filed on Aug. 10, 2015, now Pat. No. 9,318,526, which is a
(Continued)

(51) Int. Cl.
*H01L 31/18* (2006.01)
*H01L 27/146* (2006.01)

(52) U.S. Cl.
CPC ...... *H01L 27/1463* (2013.01); *H01L 27/1464* (2013.01); *H01L 27/14623* (2013.01);
(Continued)

(58) Field of Classification Search
CPC ............ H01L 27/1463; H01L 27/1464; H01L 27/14643; H01L 27/14623;
(Continued)

(56) References Cited

U.S. PATENT DOCUMENTS

| 7,518,172 | B2 | 4/2009 | Moon et al. |
| 8,357,984 | B2 | 1/2013 | Mao et al. |
| 8,390,089 | B2 | 3/2013 | Chen et al. |
| 8,928,784 | B2 | 1/2015 | Watanabe et al. |
| 9,136,298 | B2 * | 9/2015 | Lin .................. H01L 27/14643 |

(Continued)

FOREIGN PATENT DOCUMENTS

| CN | 101764142 A | 6/2010 |
| CN | 101800233 A | 8/2010 |

(Continued)

*Primary Examiner* — Thanh T Nguyen
(74) *Attorney, Agent, or Firm* — Birch, Stewart, Kolasch & Birch, LLP

(57) ABSTRACT

An image-sensor device is provided. The image-sensor device includes a semiconductor substrate having a front surface and a back surface, and an interconnection structure formed over the front surface. The image-sensor device also includes a radiation-sensing region in the semiconductor substrate. The image-sensor device further includes an isolation structure adjacent to the radiation-sensing region. The isolation structure includes a trench extends from the back surface, and a negatively charged film extends along an interior surface of the trench.

20 Claims, 5 Drawing Sheets

Related U.S. Application Data division of application No. 14/016,949, filed on Sep. 3, 2013, now Pat. No. 9,136,298.

(52) U.S. Cl.
CPC .. *H01L 27/14627* (2013.01); *H01L 27/14636* (2013.01); *H01L 27/14643* (2013.01); *H01L 27/14685* (2013.01); *H01L 27/14689* (2013.01); *H01L 31/18* (2013.01)

(58) Field of Classification Search
CPC ......... H01L 27/14627; H01L 27/14636; H01L 21/76224; H01L 27/14685; H01L 27/14689; H01L 31/18; H01L 21/76816; H01L 21/76898; H01L 27/146
See application file for complete search history.

(56) References Cited

U.S. PATENT DOCUMENTS

| | | |
|---|---|---|
| 2005/0099532 A1 | 5/2005 | Tseng |
| 2010/0155868 A1 | 6/2010 | Jang |
| 2010/0181635 A1 | 7/2010 | Wang et al. |
| 2011/0156186 A1* | 6/2011 | Iida .................. H01L 27/1463 257/432 |
| 2012/0025199 A1* | 2/2012 | Chen ................. H01L 27/1464 257/75 |
| 2015/0085168 A1 | 3/2015 | Watanabe et al. |

FOREIGN PATENT DOCUMENTS

| | | |
|---|---|---|
| KR | 10-2010-0074590 | 7/2010 |
| KR | 10-2010-0091891 | 8/2010 |

* cited by examiner

MECHANISMS FOR FORMING IMAGE-SENSOR DEVICE WITH DEEP-TRENCH ISOLATION STRUCTURE

CROSS-REFERENCE TO RELATED APPLICATIONS

This application is a Continuation application of co-pending U.S. patent application Ser. No. 14/822,575 filed on Aug. 10, 2015, which is a Divisional of U.S. patent application Ser. No. 14/016,949 filed on Sep. 3, 2013, all of which are hereby expressly incorporated by reference into the present application.

BACKGROUND OF THE INVENTION

Semiconductor image sensors are used to sense radiation such as light. Complementary metal-oxide-semiconductor (CMOS) image sensors (CIS) and charged-coupled device (CCD) sensors are widely used in various applications such as digital camera or mobile phone camera applications. These devices utilize an array of pixels in a substrate, including photodiodes and transistors, to absorb radiation projected toward the substrate and convert the sensed radiation into electrical signals.

A backside-illuminated (BSI) image-sensor device is one type of image-sensor device. The BSI image-sensor device is used for sensing a volume of light projected towards a backside surface of a substrate (which supports the image sensor circuitry of the BSI image-sensor device). The pixel grid is located at a front side of the substrate, and the substrate is thin enough so that light projected towards the backside of the substrate can reach the pixel grid. The BSI image-sensor device provides a high fill factor and reduced destructive interference, as compared to frontside-illuminated (FSI) image-sensor devices. Although existing BSI image-sensor devices and methods of fabricating these BSI image-sensor devices have been generally adequate for their intended purposes, as device scaling down continues, they have not been entirely satisfactory in all respects.

BRIEF DESCRIPTION OF THE DRAWINGS

For a more complete understanding of the present disclosure, and the advantages thereof, reference is now made to the following descriptions taken in conjunction with the accompanying drawings.

DETAILED DESCRIPTION OF THE INVENTION

Figure 1:
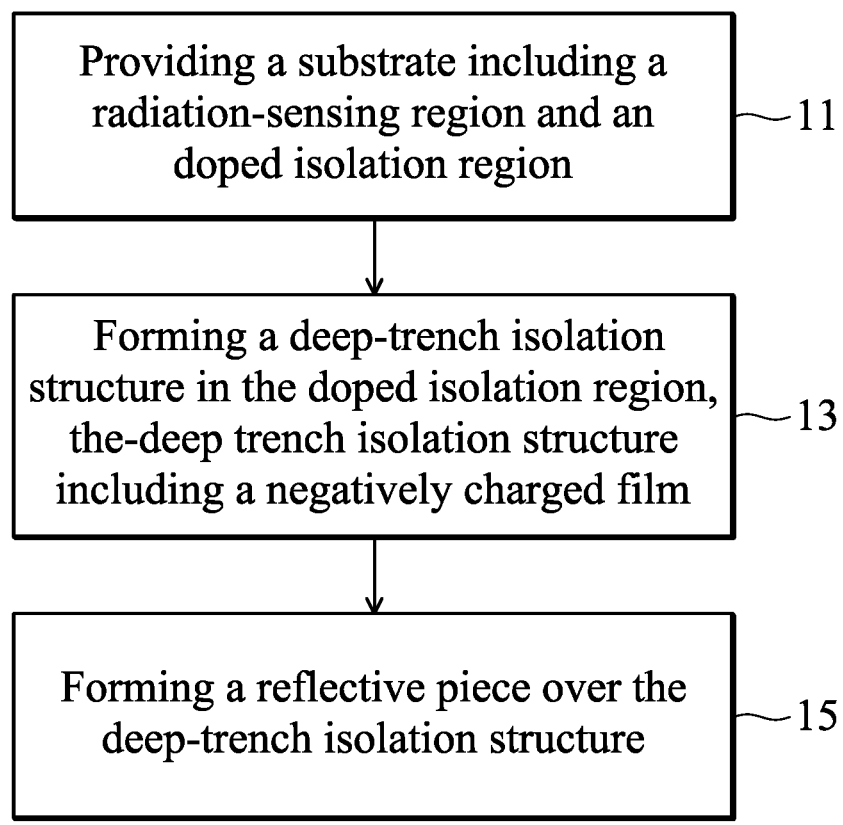
FIG. 1 shows a flow chart illustrating a method for fabricating an image-sensor device, in accordance with some embodiments.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact. In addition, the like elements in various figures and embodiments are identified by the same or similar reference numerals.

The image-sensor device according to the present disclosure is a backside-illuminated (BSI) image-sensor device. The BSI image-sensor device includes a charge-coupled device (CCD), a complementary metal oxide semiconductor (CMOS) image sensor (CIS), an active-pixel sensor (APS) or a passive-pixel sensor. The image-sensor device may include additional circuitry and input/outputs that are provided adjacent to the grid of pixels for providing an operation environment of the pixels and for supporting external communication with the pixels.

Illustrated in FIG. 1 is a flowchart of a method for fabricating an image-sensor device according to some embodiments. Referring to FIG. 1, the method 10 begins with a block 11 in which a substrate having a front surface and a back surface is provided. The substrate includes a radiation-sensing region and a doped isolation region adjacent to the radiation-sensing region. The method 10 continues with a block 13 in which a deep-trench isolation structure is formed. The deep-trench isolation structure includes a trench extending from the back surface and a negatively charged film covering the trench. The method 10 continues with a block 15 in which a reflective piece is formed over the deep-trench isolation structure.

FIGS. 2-9 are diagrammatic fragmentary cross-sectional views of an image-sensor device at various stages of fabrication, in accordance with some embodiments. It is understood that FIGS. 2-9 have been simplified for a better understanding of embodiments of the present disclosure.

Figure 2:
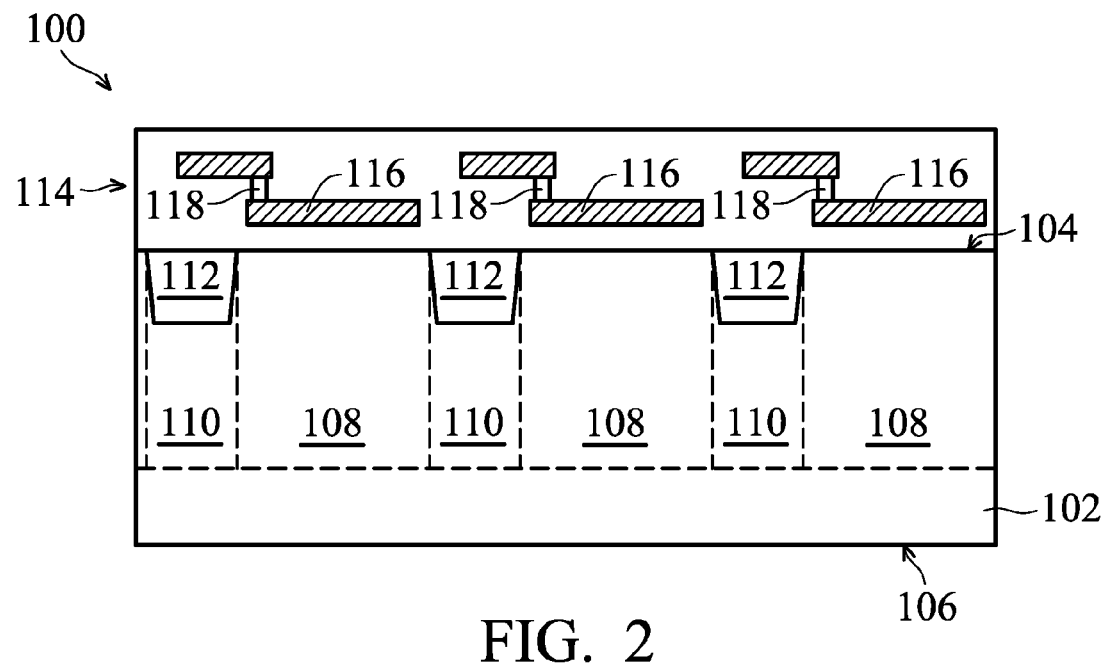
FIGS. 2-9 are diagrammatic fragmentary cross-sectional views of an image-sensor device at various stages of fabrication, in accordance with some embodiments.

Referring to FIG. 2, the image-sensor device 100 includes a substrate 102. The substrate 102 is a device substrate. The substrate 102 may be a semiconductor substrate. The substrate 102 may be a silicon substrate doped with a P-type dopant such as boron, in which case the substrate 102 is a P-type substrate. Alternatively, the substrate 102 could be another suitable semiconductor material. For example, the substrate 102 may be a silicon substrate doped with an N-type dopant such as phosphorous or arsenic, in which case the substrate is an N-type substrate. The substrate 102 may include other elementary semiconductor materials such as germanium or diamond. The substrate 102 may optionally include a compound substrate and/or an alloy semiconductor. Further, the substrate 102 may include an epitaxial layer (epi layer), may be strained for performance enhancement, and may include a silicon-on-insulator (SOI) structure.

The substrate 102 has a front surface 104 (also referred to as a frontside) and a back surface 106 (also referred to as a backside). For a BSI image sensor device such as the image-sensor device 100, incident radiation enters the substrate 102 through the back surface 106. In some embodiments, the substrate 102 has a thickness ranging from about 500 μm to about 1000 μm. The substrate 102 is fabricated with front end processes, in accordance with some embodiments. For example, the substrate 102 includes various regions, which may include a pixel region, a periphery region, a bonding pad region, and a scribe line region. For the sake of simplicity, only a portion of the pixel region is shown in FIGS. 2 to 9.

The pixel region includes radiation-sensing regions 108 and doped isolation regions 110. The radiation-sensing regions 108 are doped with a doping polarity opposite from that of the substrate 102. The radiation-sensing regions 108 are formed by one or more implantation processes or diffusion processes. The radiation-sensing regions 108 are formed adjacent to or near the front surface 104 of the substrate 102. Although only a portion of the pixel region is shown in FIG. 2, the pixel region may further include pinned layer photodiodes, photodiode gates, reset transistors, source follower transistors, and transfer transistors. For the sake of simplicity, detailed structures of the above features are not shown in figures of the present disclosure.

The radiation-sensing regions 108 are operable to sense incident radiation that enters the pixel region from the back surface 106. The incident radiation may be visual light. Alternatively, the incident radiation may be infrared (IR), ultraviolet (UV), X-ray, microwave, other suitable types of radiation, or a combination thereof.

The doped isolation regions 110 are adjacent to the radiation-sensing regions 108, in accordance with some embodiments. The doped isolation regions 110 are formed adjacent to or near the front surface 104. Each pair of neighboring radiation-sensing regions 108 is separated from one another by one of the respective doped isolation regions 110. The doped isolation regions 110 are doped with a doping polarity the same as that of the substrate 102. In some embodiments, the doping concentration of the doped isolation regions 110 is higher than that of the substrate 102. For example, the doping concentration of the doped isolation regions 110 may be in a range of about $1E16$ per $cm^3$ to about $1E20$ per $cm^3$. The doped isolation regions 110 are formed by one or more implantation processes or diffusion processes.

As shown in FIG. 2, isolation features 112 are formed in the doped isolation regions 110, in accordance with some embodiments. The isolation features 112 are formed adjacent to or near the front surface 104 of the substrate 102. In some embodiments, the isolation features 112 are used to define predetermined regions of the radiation-sensing regions 108 and doped isolation regions 110. Therefore, the isolation features 112 may be formed before forming the radiation-sensing regions 108 and doped isolation regions 110. In some embodiments, the doped isolation regions 110 are aligned with the isolation features 112.

The isolation features 112 include shallow trench isolation (STI) structures and/or local oxidation of silicon (LOCOS) structures. In some embodiments, some active or passive features, such as MOSFET or junction capacitor, are formed in the doped isolation regions 110, according to design needs and manufacturing concerns. The active or passive features in the doped isolation regions 110 are surrounded and protected by the isolation features 112. The thickness of the isolation features 112 is greater than that of the active or passive features in the doped isolation regions 110. In some embodiments, the thickness of the isolation features 112 is in a range from about 100 angstrom to about 5000 angstrom.

In some embodiments, the isolation features 112 are formed by forming trenches in the substrate 102 from the front surface 104 and filling a dielectric material into the trenches. The dielectric material may include silicon oxide, silicon nitride, silicon oxynitride, a low-k material, or another suitable dielectric material. A chemical mechanical polishing (CMP) process may be performed to planarize the surface of the dielectric material filling the trenches.

As shown in FIG. 2, the image-sensor device 100 may further include an interconnection structure 114 formed over the front surface 104 of the substrate 102. The interconnection structure 114 includes a number of patterned dielectric layers and conductive layers that couple to various doped features, circuitry, and input/output of the image-sensor device 100. The interconnection structure 114 includes an interlayer dielectric (ILD) and a multilayer interconnection (MLI) structure. The MLI structure includes contacts, vias and metal lines. For the purpose of illustration, a number of conductive lines 116 and vias/contacts 118 are shown in FIG. 2, it being understood that the conductive lines 116 and vias/contacts 118 are merely exemplary. The actual positioning and configuration of the conductive lines 116 and vias/contacts 118 may vary depending on design needs and manufacturing concerns.

Figure 3:
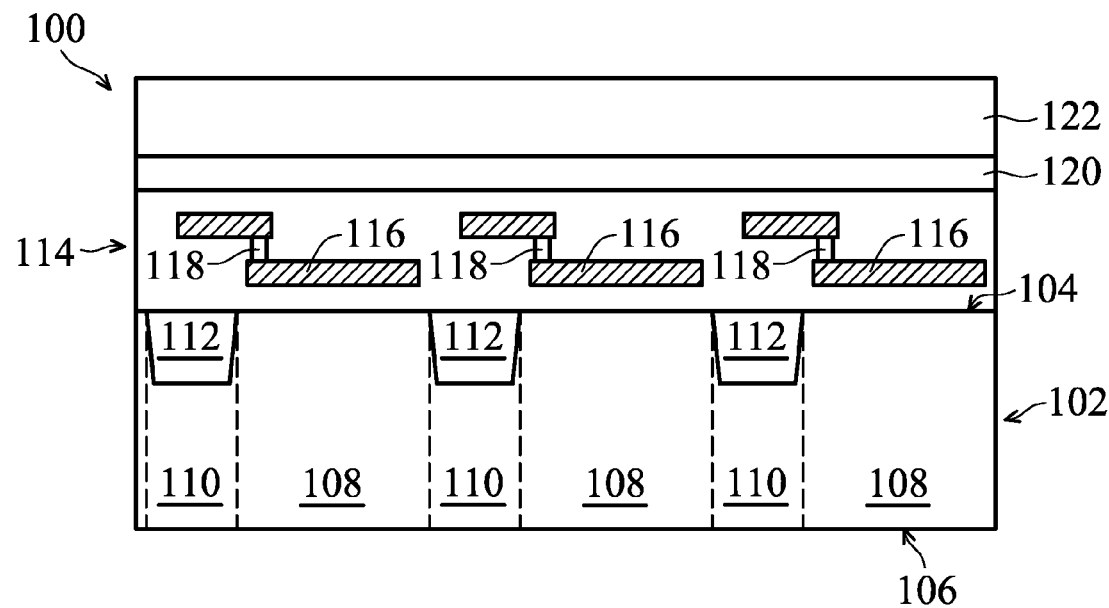

Referring to FIG. 3, a buffer layer 120 is formed on the interconnection structure 114, in accordance with some embodiments. The buffer layer 120 may include a dielectric material such as silicon oxide. Alternatively, the buffer layer 120 may include silicon nitride. The buffer layer 120 may be deposited by chemical vapor deposition (CVD), physical vapor deposition (PVD), or other suitable techniques. The buffer layer 120 may be planarized to form a smooth surface by a CMP process.

Afterwards, a carrier substrate 122 is bonded with the substrate 102 through the buffer layer 120. Therefore, the processing of the back surface 106 of the substrate 102 can be performed. In some embodiments, the carrier substrate 122 is similar to the substrate 102 and includes a silicon material. Alternatively, the carrier substrate 122 may include a glass substrate or another suitable material. The carrier substrate 122 may be bonded to the substrate 102 by molecular forces (direct bonding), optical fusion bonding, metal diffusion bonding, anodic bonding, or by other suitable bonding techniques. The buffer layer 120 provides electrical isolation between the substrate 102 and carrier substrate 122. The carrier substrate 122 provides protection for the various features formed on the front surface 104 of the substrate 102. The carrier substrate 122 also provides mechanical strength and support for processing the back surface 106 of the substrate 102 as discussed below.

After the carrier substrate 122 is bonded, a thinning process is then performed to thin the substrate 102 from the back surface 106. The thinning process may include a mechanical grinding process. Afterwards, an etching chemical may be applied over the back surface 106 of substrate 102 to further thin the substrate 102 to a thickness which is on the order of a few microns. In some embodiments, the thickness of the substrate 102, after being thinned, is in a range from about 1 μm to about 100 μm.

Common image-sensor device defects include optical cross-talk, electrical cross-talk and dark current. The defects become more serious as the image pixel sizes and the spacing between neighboring image pixels continues to shrink. Optical cross-talk refers to photon interference from neighboring pixels that degrades the light-sensing reliability and accuracy of the pixels. Dark current may be defined as the existence of pixel current when no actual illumination is present. In other words, the dark current is the current that flows through the photodiode when no photons are entering the photodiode. White pixels occur where an excessive amount of current leakage causes an abnormally high signal from the pixels. In the image-sensor device 100 shown in FIG. 3, the doped isolation regions 110 have a doping polarity opposite to that of the radiation-sensing regions 108 to reduce the dark current and white pixel defects. However, the doped isolation regions 110 alone may not effective enough to prevent dark current and white pixel defects. In addition, the doped isolation regions 110 could not resolve the optical cross-talk defect due to the similar refractive index of the radiation-sensing regions 108 and doped isolation regions 110.

Figure 4:
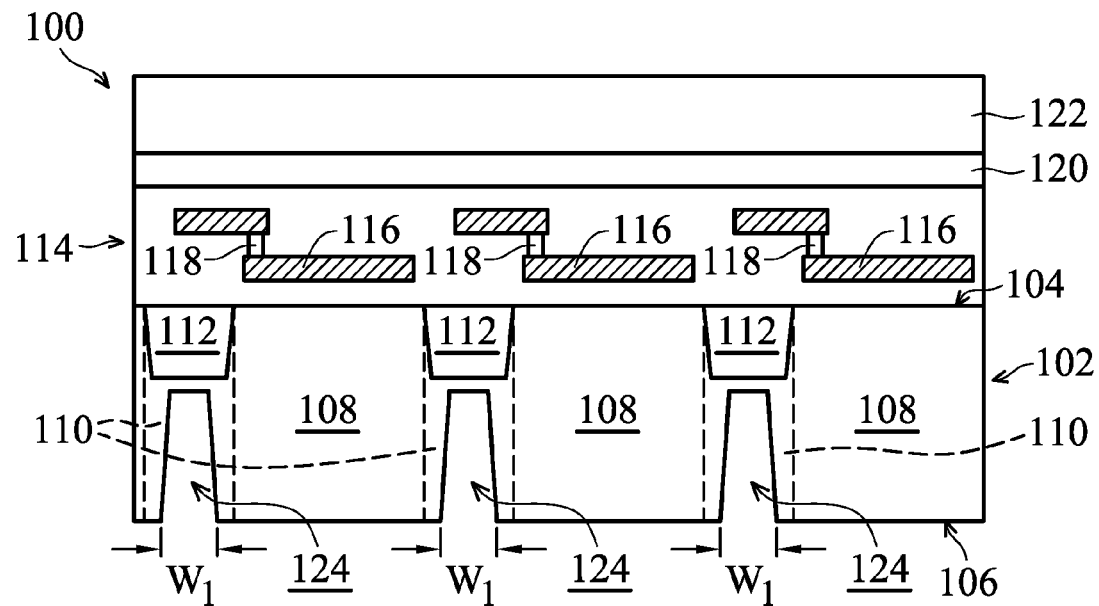

Referring to FIG. 4, an etching process is performed on the back surface 106 of the substrate 102 to form a number of openings 124 (or trenches/recesses). The etching process includes a dry etching process. An etching mask (for example a hard mask, not illustrated herein) may be formed before the etching process is performed. Each of the openings 124 has a width $W_1$ at the back surface 106 of the substrate 102. The width $W_1$ may be smaller than or substantially equal to that of the doped isolation regions 110. The openings 124 may have a rectangular shape, a trapezoidal shape, or another suitable shape. In some embodiments, each of the openings 124 extends over half of the thickness of the substrate 102 but does not reach the isolation features 112. Accordingly, active or passive features surrounded by the isolation features 112 may be not damaged by the etching process. In some embodiments, the depth of the openings 124, measured from the back surface 106 of the substrate 102, is in a range from about 1 μm to about 10 μm. The depth of the openings 124 may be adjusted by time control without using an etching stop layer. These openings 124 are used for forming deep-trench isolation (DTI) structures, which will be discussed in more detail below.

Figure 5:
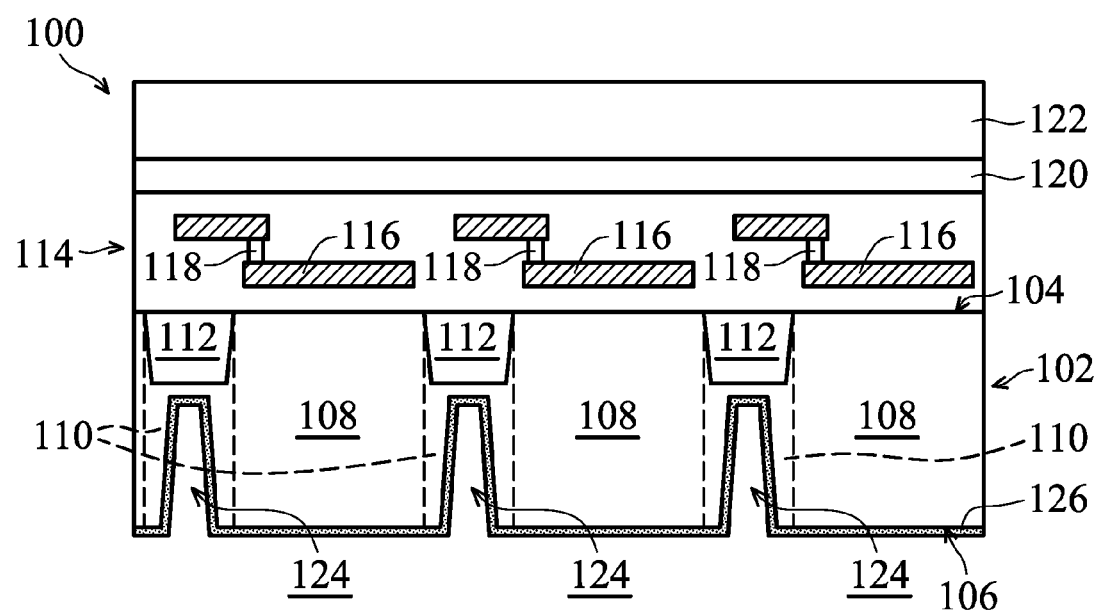

Referring to FIG. 5, a negatively charged film 126 is formed over the back surface 106 of substrate 102, in accordance with some embodiments. The negatively charged film 126 may conformally cover the back surface 106, including covering interior surfaces of the openings 124 in a conformal manner. The negatively charged film 126 has a greater overall negative charge than traditional dielectric films. The negative charge increases hole accumulation at an interface of the negatively charged film 126 and creates a depletion region at or close to the interface of the negatively charged film 126 and doped isolation regions (i.e., p-type) 110 of the substrate 102 around the radiation-sensing regions 108. The depletion region reduces dark current and/or white pixels.

According to one or more embodiments, the negatively charged film 126 is a high-k metal oxide. The high-k metal oxide may be a hafnium oxide, aluminum oxide, zirconium oxide, magnesium oxide, calcium oxide, yttrium oxide, tantalum oxide, strontium oxide, titanium oxide, lanthanum oxide, barium oxide or other metal oxides that can form a high-k film using existing semiconductor deposition technologies. The high-k metal oxide may be deposited using a CVD process or a PVD process. The CVD process may be plasma enhanced chemical vapor deposition (PECVD) including ICPECVD, a low pressure chemical vapor deposition (LPCVD), or an atomic layer deposition (ALD) with or without plasma. These processes may be tuned to favor an accumulation of negative charge by varying the process parameters including various flow rates and power parameters, and may involve a treatment step after the film deposition to increase negative charge. The resulting high-k metal oxide film may have an oxygen-rich composition with negatively charged interstitial oxygen atoms and/or dangling/broke metal oxide bonds, both of which results in a cumulated negative charge. The cumulated negative charge may be around 5E9 to around 1E14 per $cm^2$, or greater than about 1E10/$cm^2$. In other words, the total charge (Qtot) for the layer is around −5E9 to around −1E14 per $cm^2$, or more negative than about 1E10/$cm^2$.

According to other embodiments, the negatively charged film 126 is a silicon nitride or nitride dielectric. The nitride material may be a nitrogen-rich silicon nitride or another nitrogen-rich dielectric film, such as tantalum nitride, titanium nitride, hafnium nitride, aluminum nitride, magnesium nitride, or other metal nitrides that can be formed using existing semiconductor deposition technologies. The nitride material may be deposited using a CVD technique or a PVD technique. The CVD process may be a PECVD including ICPECVD, an LPCVD, or an ALD with or without plasma. In some embodiments, the negatively charged film is a plasma nitrided material. The plasma nitridation may occur during or after film deposition in an after treatment, if a nonplasma deposition technique is used, by using a plasma containing nitrogen ions. The plasma nitridation creates a nitrogen-rich film with a cumulated negative charge. In some embodiments, the negative charge is increased by a thermal or plasma treatment with ammonia. The cumulated negative charge is around 1E9 to around 1E13 per $cm^2$, or greater than about 5E9/$cm^2$. In other words, the total charge (Qtot) for the layer is around −1E9 to around −1E13 per $cm^2$, or more negative than about 5E9/$cm^2$. In some embodiments, the negatively charged film 126 has a thickness ranging from about 1 nm to about 500 nm. In some other embodiments, the negatively charged film 126 has a thickness ranging from about 1 nm to about 100 nm.

Figure 6:
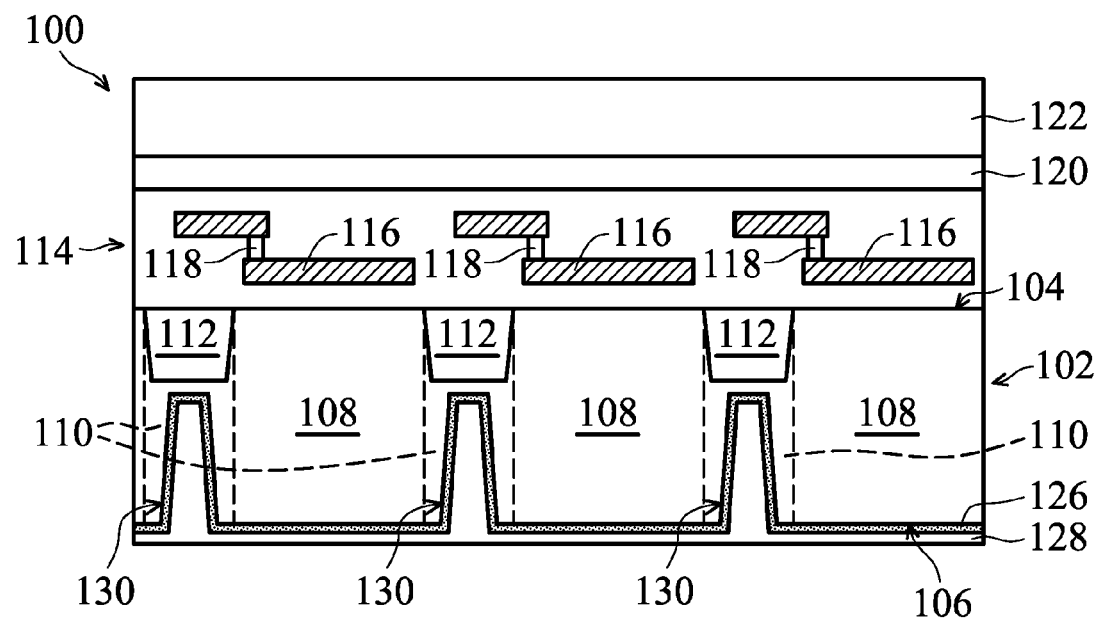

Afterwards, referring to FIG. 6, a dielectric material 128 is deposited over the back surface 106 of the substrate 102, in accordance with some embodiments. The dielectric material 128 fills the remaining spaces of the openings 124. In some embodiments, the dielectric material 128 includes silicon oxide, silicon nitride, silicon oxynitride, spin on glass (SOG), low-k dielectric, or another suitable dielectric material. The dielectric material 128 may be deposited by CVD, PVD, or another suitable depositing technique. In some embodiments, a portion of the dielectric material 128 outside the openings 124 is thinned and planarized. In the following discussion, the openings 124 and portions of the negatively charged film 126 and dielectric material 128 in the openings 124 are collectively referred to as deep-trench isolation structures 130.

Figure 7:
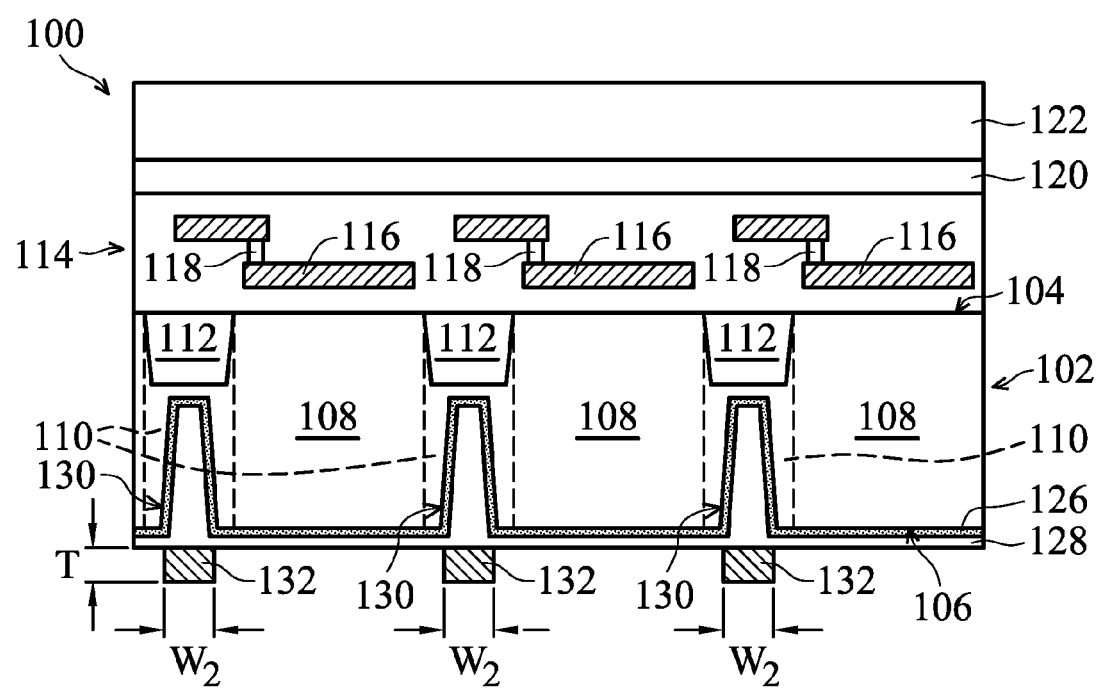

Afterwards, referring to FIG. 7, a reflective grid 132 is formed over the substrate 102, in accordance with some embodiments. For example, the reflective grid 132 is formed on the dielectric material 128. Each piece of the reflective grid 132 is aligned with one of the respective deep-trench isolation structures 130. In some embodiments, the reflective grid 132 is formed of a metal material, such as aluminum, tungsten, copper, tantalum, titanium, alloys thereof, or combinations thereof. Each piece of the reflective grid 132 may have a rectangular shape, a reverse trapezoidal shape, reverse triangle shape, or another suitable shape. In some embodiments, each piece of the reflective grid 132 have a thickness T ranging from about 100 Å to about 15000 Å. The reflective grid 132 is formed by a suitable deposition process and then patterned. The deposition process includes electroplating, sputtering, CVD, PVD or other suitable depositing techniques. The CVD process may be a PECVD including ICPECVD, an LPCVD, or an ALD with or without plasma.

In some embodiments, each piece of the reflective grid 132 has a width $W_2$ at the back surface 106. For example, the width $W_2$ is in a range from 10 to 1000 nm. The width $W_2$ is substantially equal to or greater than the width $W_1$ of the deep-trench isolation structures 130 to cover the deep-trench isolation structures 130. Therefore, the reflective grid 132 prevents the nearly vertical incident radiation from travelling into the deep-trench isolation structures 130. The nearly vertical incident radiation that travels into the deep-trench isolation structures 130 may be refracted to adjacent radiation-sensing regions 108, and undesired photo cross-talk would occur.

Figure 8:
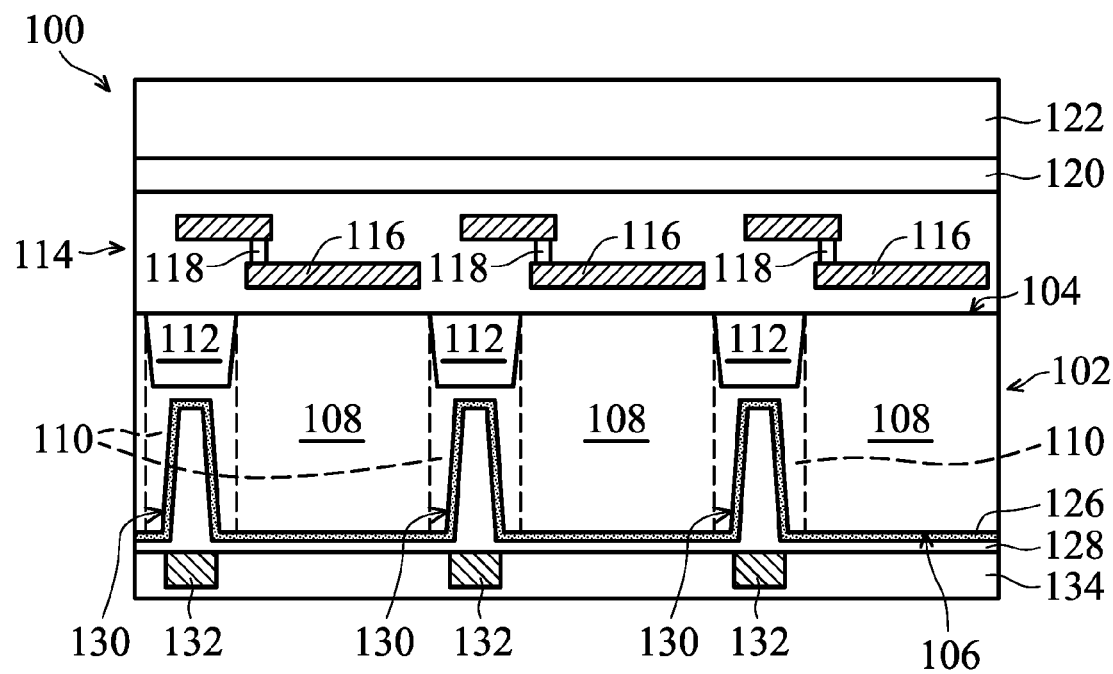

Afterwards, referring to FIG. 8, a transparent filling layer 134 is deposited over the back surface 106 of the substrate 102, in accordance with some embodiments. The transparent filling layer 134 may be made of silicon oxide, silicon nitride, or suitable polymers, and may be formed by suitable techniques, such as CVD, PVD, or combinations thereof. In some embodiments, the transparent filling layer 134 has a thickness greater than that of the reflective grid 132. Accordingly, the transparent filling layer 134 covers the reflective grid 132 and provides a smooth surface. For example, the transparent filling layer 134 has a thickness ranging from about 10 angstrom to about 1000 angstrom. In some embodiments, the transparent filling layer 134 functions as an antireflective layer of the image-sensor device 100. The antireflective layer serves to reduce reflection of the incident radiation projected toward the back surface 106 of the image-sensor device 100.

Figure 9:
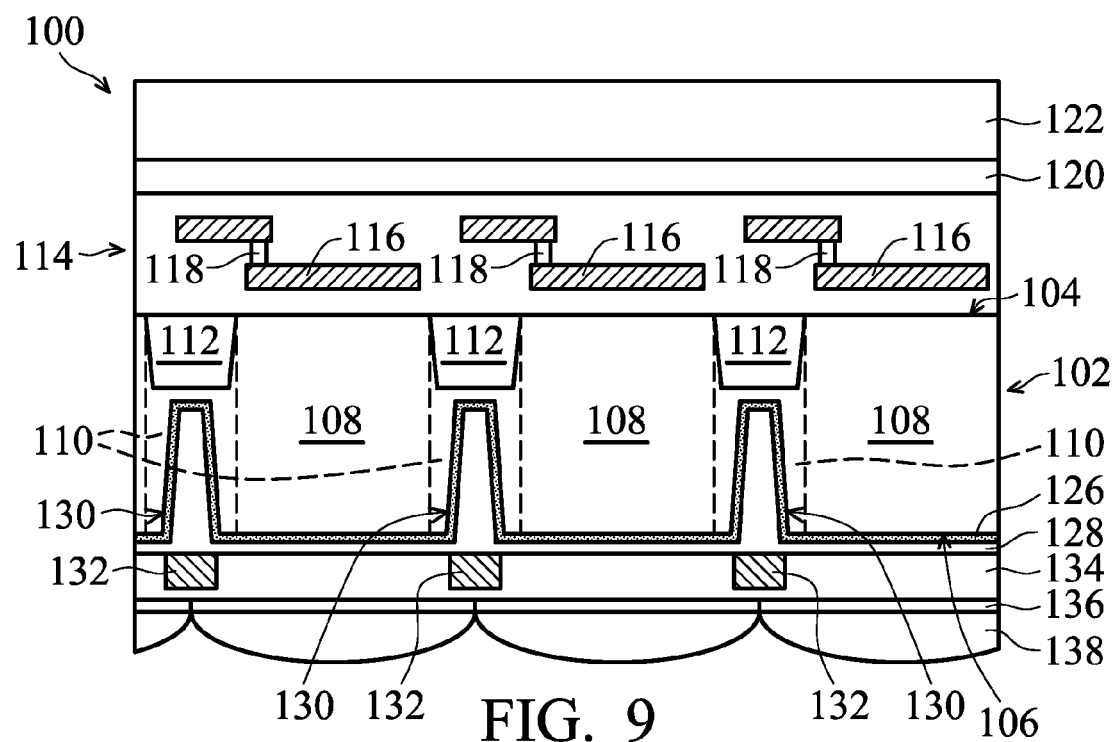

Thereafter, referring to FIG. 9, a color filter layer 136 is formed over the transparent filling layer 134, in accordance with some embodiments. The color filter layer 136 supports the filtering of incident radiation having a particular range of wavelengths, which may correspond to a particular color of light, for example, red, green, or blue. The color filter layer 136 may be used to allow only light having a predetermined color to reach of the radiation-sensing regions 108. Afterwards, a micro lens layer 138 may be formed over the color filter layer 136 for directing incident radiation toward the radiation-sensing regions. The micro lens layer 138 may be positioned in various arrangements and have various shapes depending on the refractive index of the material used for the micro lens layer 138 and/or the distance between the micro lens layer 138 and the radiation-sensing regions 108. Alternatively, the position of the color filter layer 136 and micro lens layer 138 may be reversed such that the micro lens layer 138 may be disposed between the back surface 106 of the substrate 102 and color filter layer 138.

Embodiments of mechanisms for forming an image-sensor device are described. Deep-trench isolation structures, which are formed from the back surface of the substrate and include a negatively charged film, may further reduce the dark current and white pixel defects. In addition, a reflective grid formed over the deep-trench isolation structures may prevent incident radiation from traveling into the deep-trench isolation structures. Therefore, the photo cross-talk defect is also reduced or prevented.

In accordance with some embodiments, an image-sensor device is provided. The image-sensor device includes a substrate having a front surface and a back surface. The image-sensor device also includes a radiation-sensing region operable to detect incident radiation that enters the substrate through the back surface. The image-sensor device further includes a doped isolation region formed in the substrate and adjacent to the radiation-sensing region. In addition, the image-sensor device includes a deep-trench isolation structure formed in the doped isolation region. The deep-trench isolation structure includes a trench extending from the back surface into the doped isolation region and a negatively charged film covering an interior surface of the trench.

In accordance with some embodiments, an image-sensor device is provided. The image-sensor device includes a substrate having a front surface and a back surface. The image-sensor device also includes a plurality of radiation-sensing regions formed in the substrate. The image-sensor device further includes a plurality of doped isolation regions formed in the substrate. Each pair of neighboring radiation-sensing regions is separated from one another by one of the respective doped isolation regions. In addition, the image-sensor device includes a plurality of trenches extending from the back surface into the doped isolation regions. The image-sensor device also includes a negatively charged film covering interior surfaces of the trenches and a dielectric material over the negatively charged film and filling the trenches. The image-sensor device further includes a reflective grid formed over the back surface of the substrate, and each piece of the reflective grid is aligned with one of the respective trenches.

In accordance with some embodiments, a method of fabricating an image-sensor device is provided. The method includes providing a substrate having a front surface and a back surface. The method also includes forming a radiation-sensing region and a doped isolation region adjacent to the front surface, and the doped isolation region is adjacent to the radiation doped region. The method further includes forming a trench in the doped isolation region from the back surface. In addition, the method includes forming a negatively charged film over the back surface and covering an interior surface of the trench.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and operations described in the specification. As one of ordinary skill in the art will readily appreciate from the disclosure of the present disclosure, processes, machines, manufacture, compositions of matter, means, methods, or operations, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or operations.

What is claimed is:

1. An image-sensor device, comprising:
   a semiconductor substrate having a front surface and a back surface;
   an interconnection structure formed over the front surface;
   a radiation-sensing region in the semiconductor substrate;
   an isolation structure adjacent to the radiation-sensing region, wherein the isolation structure comprises:
   a trench extends from the back surface;
   a negatively charged film extends along an interior surface of the trench, wherein the negatively charged film is made of a dielectric material; and
   a second dielectric material over the negatively charged film and filling the trench.

2. The image-sensor device as claimed in claim 1, wherein the negatively charged film comprises oxygen-rich silicon oxide, high-k metal oxide, or silicon nitride.

3. The image-sensor device as claimed in claim 1, wherein the negatively charged film further extends outside of the trench.

4. The image-sensor device as claimed in claim 3, wherein the negatively charged film covers the back surface of the semiconductor substrate.

5. The image-sensor device as claimed in claim 4, wherein the negatively charged film is in direct contact with the radiation-sensing region.

6. The image-sensor device as claimed in claim 1, wherein the trench gradually becomes narrower along a direction from the back surface towards the front surface.

7. The image-sensor device as claimed in claim 1, wherein the negatively charged film does not completely fill the trench.

8. The image-sensor device as claimed in claim 1, wherein a bottom surface of the trench is separated from the front surface of the semiconductor substrate.

9. The image-sensor device as claimed in claim 1, further comprising forming a reflective piece over the back surface of the semiconductor substrate, wherein the reflective piece is substantially aligned with the trench.

10. The image-sensor device as claimed in claim 1, further comprising a doped isolation region surrounding the trench, wherein a portion of the doped isolation region is between the negatively charged film and the radiation-sensing region.

11. An image-sensor device, comprising
a substrate having a front surface and a back surface;
an interconnection structure formed over the front surface;
a plurality of radiation-sensing regions formed in the substrate;
a plurality of recesses extending from the back surface into the substrate and not reaching the front surface of the substrate; wherein each pair of neighboring radiation-sensing regions is separated from one another by one of the recesses;
a negatively charged film covering interior surfaces of the recesses, wherein the negatively charged film comprises an oxide material or a nitride material;
a dielectric material on the negatively charged film; and
a reflective grid formed over the back surface of the substrate, wherein the reflective grid is aligned with respective one of the recesses.

12. The image-sensor device as claimed in claim 11, wherein the negatively charged film further extends outside of the recesses.

13. The image-sensor device as claimed in claim 11, wherein the negatively charged film is in direct contact with the radiation-sensing regions.

14. The image-sensor device as claimed in claim 11, wherein each of the recesses gradually becomes narrower along a direction from the back surface towards the front surface.

15. The image-sensor device as claimed in claim 11, further comprising an isolation feature extends from the front surface towards the back surface of the substrate, wherein the isolation feature is substantially aligned with one of the recesses.

16. An image-sensor device, comprising:
a semiconductor substrate having a front surface and a back surface;
an interconnection structure formed over the front surface;
a radiation-sensing region in the semiconductor substrate;
an isolation structure adjacent to the radiation-sensing region, wherein the isolation structure comprises:
a recess extending from the back surface and over a half of the thickness of the semiconductor substrate; and
a negatively charged film over an interior surface of the recess and a back surface of the semiconductor substrate; and
a doped isolation region surrounding the recess, wherein a portion of the doped isolation region is between the negatively charged film and the radiation-sensing region.

17. The image-sensor device as claimed in claim 16, the radiation-sensing region and the doped isolation region have different doping polarities.

18. The image-sensor device as claimed in claim 16, wherein the doped isolation region and the negatively charged film are in direct contact with the radiation-sensing region.

19. The image-sensor device as claimed in claim 16, wherein the negatively charged film covers an interface between the doped isolation region and the radiation-sensing region.

20. The image-sensor device as claimed in claim 16, wherein the negatively charged film is made of a dielectric material.

* * * * *